US008809956B2

(12) United States Patent
Cho

(10) Patent No.: US 8,809,956 B2
(45) Date of Patent: Aug. 19, 2014

(54) VERTICALLY ORIENTED SEMICONDUCTOR DEVICE AND SHIELDING STRUCTURE THEREOF

(75) Inventor: Hsiu-Ying Cho, Hsin Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 182 days.

(21) Appl. No.: 13/272,866

(22) Filed: Oct. 13, 2011

(65) Prior Publication Data

US 2013/0093045 A1 Apr. 18, 2013

(51) Int. Cl.
*H01L 27/12* (2006.01)
*H01L 21/20* (2006.01)
*H01L 21/02* (2006.01)

(52) U.S. Cl.
CPC ................ *H01L 27/12* (2013.01); *H01L 21/20* (2013.01); *H01L 21/02* (2013.01)
USPC ............................ 257/351; 438/381; 257/534

(58) Field of Classification Search
CPC .................... H01F 27/2885; H01F 2027/2809; H01L 23/5223; H01L 23/5225; H01L 23/5227; H01L 28/60; H01L 27/16
USPC ...................... 257/531, 534, 29.243; 438/381
See application file for complete search history.

(56) References Cited

U.S. PATENT DOCUMENTS 6,383,858 B1 * 5/2002 Gupta et al. .................. 438/238
6,743,671 B2 6/2004 Hu et al.
7,485,912 B2 2/2009 Wang
2003/0127704 A1 * 7/2003 Kobayashi et al. ........... 257/531
2004/0178472 A1 * 9/2004 Zhang et al. .................. 257/531
2006/0163692 A1 * 7/2006 Detecheverry et al. ....... 257/531
2007/0052062 A1 * 3/2007 Ding et al. .................... 257/528
2007/0235838 A1 * 10/2007 Wang ........................... 257/532
2008/0237789 A1 * 10/2008 He et al. ....................... 257/531
2009/0322447 A1 * 12/2009 Daley et al. .................. 333/185
2010/0141354 A1 6/2010 Cho
2010/0214041 A1 8/2010 Cho

OTHER PUBLICATIONS

Unpublished U.S. Appl. No. 13/411,052, filed Mar. 2, 2012 entitled "Structure and Method for a Fishbone Differential Capacitor," 38 pages.
Unpublished U.S. Appl. No. 13/158,044, filed Jun. 10, 2011 entitled "A Vertical Interdigitated Semiconductor Capacitor", 33 pages.
Unpublished U.S. Appl. No. 13/212,982, filed Aug. 18, 2011 entitled "Vertically Oriented Semiconductor Device and Shielding Structure Thereof", 44 pages.
Unpublished U.S. Appl. No. 13/227,242, filed Sep. 7, 2011 entitled "A Horizontal Interdigitated Capacitor Structure with Vias," 44 pages.
Unpublished U.S. Appl. No. 13/280,786, filed Oct. 25, 2011 entitled "Structure and Method for a High-K Transformer with Capacitive Coupling," 39 pages.

(Continued)

*Primary Examiner* — Long K Tran
*Assistant Examiner* — Dzung Tran
(74) *Attorney, Agent, or Firm* — Haynes and Boone, LLP

(57) ABSTRACT

The present disclosure involves a semiconductor device. The semiconductor device includes a substrate; a capacitor disposed over the substrate; an inductor disposed over the substrate and having a coil feature surrounding the capacitor; and a shielding structure over the substrate and configured around the coil feature.

18 Claims, 15 Drawing Sheets

(56) References Cited

OTHER PUBLICATIONS

Kawano, Yoichi, et al., "A 77GHz Transceiver in 90nm CMOS," 2009 IEEE International Solid-State Circuits Conference, 978-1-4244-3457-2/09, ISSCC 2009/Session 18/Ranging and Gb/s Communication/18.3, 3 pages.

Lim, Chee Chong, et al., "Fully Symmetrical Monolithic Transformer (True 1:1) for Silicon RFIC," IEEE Transactions on Microwave Theory and Techniques, vol. 56, No. 10, Oct. 2008, pp. 2301-2311.

Unpublished U.S. Appl. No. 13/212,987, filed Aug. 18, 2011 entitled "Vertically Oriented Semiconductor Device and Shielding Structure Thereof," 45 pages.

Unpublished U.S. Appl. No. 13/212,976, filed Aug. 18, 2011 entitled "Vertically Oriented Semiconductor Device and Shielding Structure Thereof," 44 pages.

* cited by examiner

X
Y
Z
38
40
42
44

VERTICALLY ORIENTED SEMICONDUCTOR DEVICE AND SHIELDING STRUCTURE THEREOF

CROSS-REFERENCE

The present disclosure is related to the following commonly-assigned U.S. patent applications, the entire disclosures of which are incorporated herein by reference: U.S. patent application Ser. No. 13/158,044, filed Jun. 10, 2011, by inventor Hsiu-Ying Cho for "A VERTICAL INTERDIGITATED SEMICONDUCTOR CAPACITOR"U.S. patent application Ser. No. 13/212,982, filed Aug. 18, 2011, by inventor Hsiu-Ying Cho for "VERTICAL ORIENTED SEMICONDUCTOR DEVICE AND SHIELDING STRUCTURE THEREOF"; and U.S. patent application Ser. No. 13/227,242, filed Sep. 7, 2011, by inventor Hsiu-Ying Cho for "A HORIZONTAL INTERDIGITATED CAPACITOR STRUCTURE WITH VIAS".

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of integrated circuit evolution, functional density (i.e., the number of interconnected devices per chip area) has generally increased while geometry size (i.e., the smallest component (or line) that can be created using a fabrication process) has decreased.

Various active or passive electronic components can be formed on a semiconductor IC. For example, transformers, inductors, capacitors, etc., may be formed on a semiconductor IC. However, conventional electronic components formed on an IC may face shortcomings such as excess space consumption, poor device performance, inadequate shielding, and high fabrication costs.

Therefore, while existing electronic components on semiconductor ICs have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
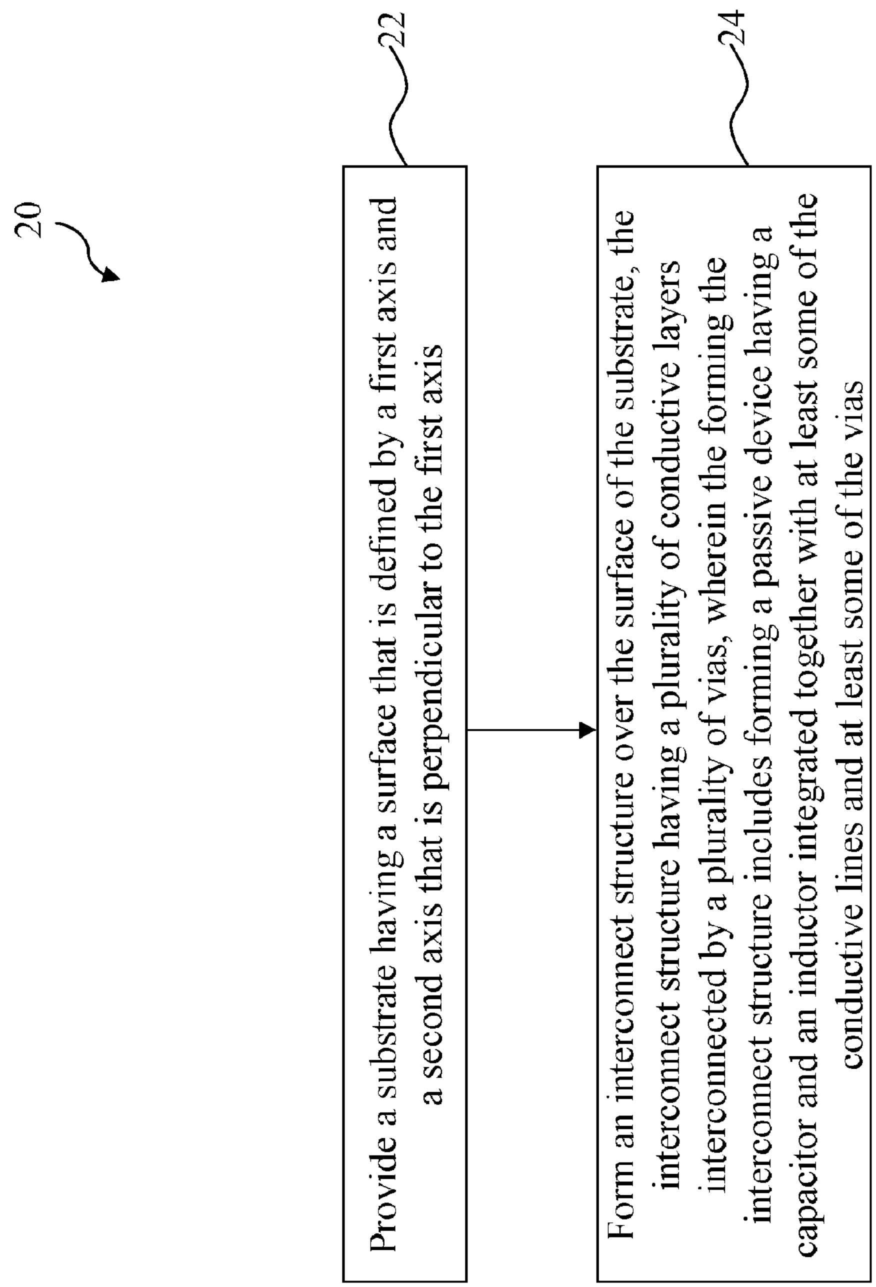
FIG. 1 is a flowchart illustrating a method of fabricating a semiconductor device according to various aspects of the present disclosure.

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 2:
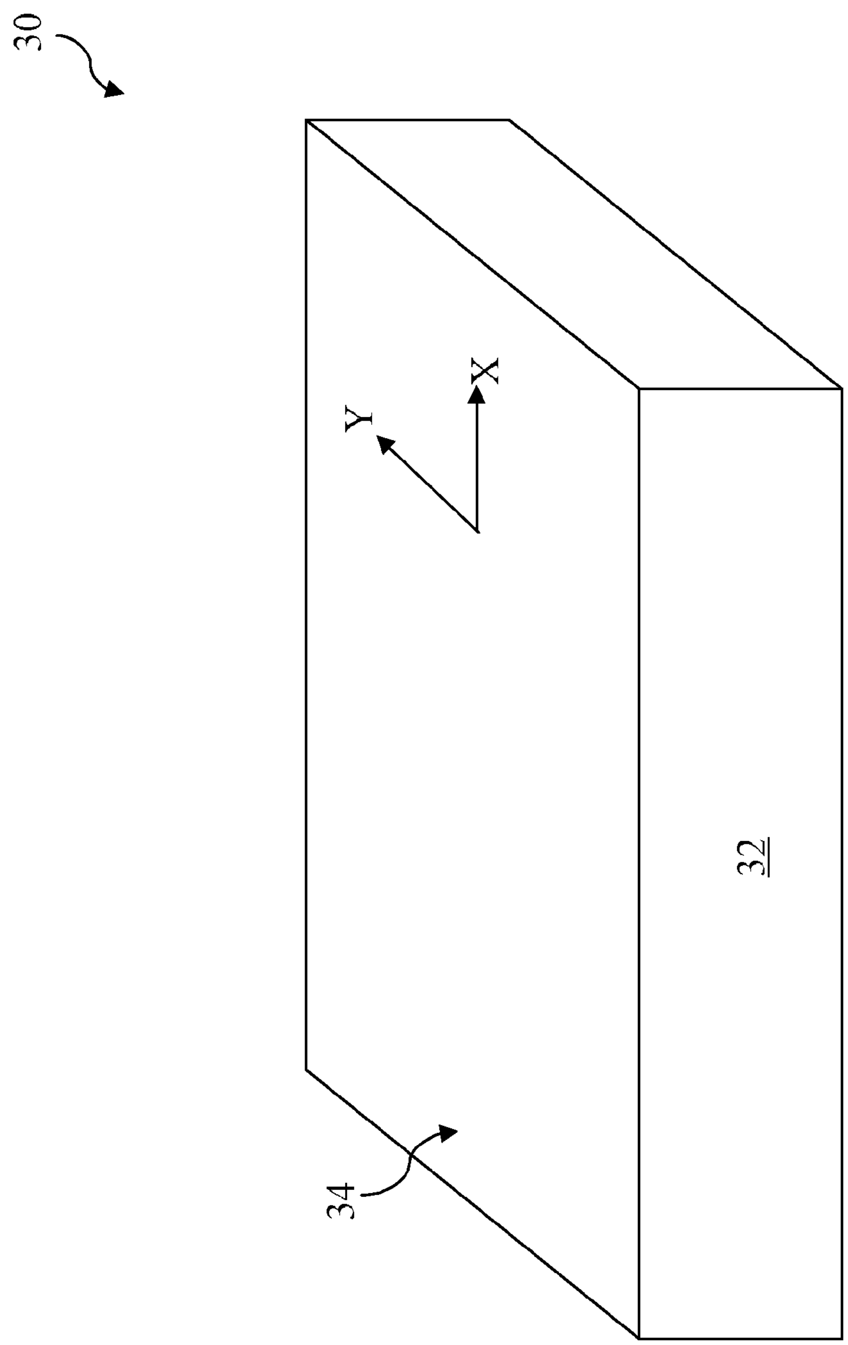
FIGS. 2-3 are diagrammatic fragmentary cross-sectional side views of a semiconductor device at different stages of fabrication.
Figure 3:
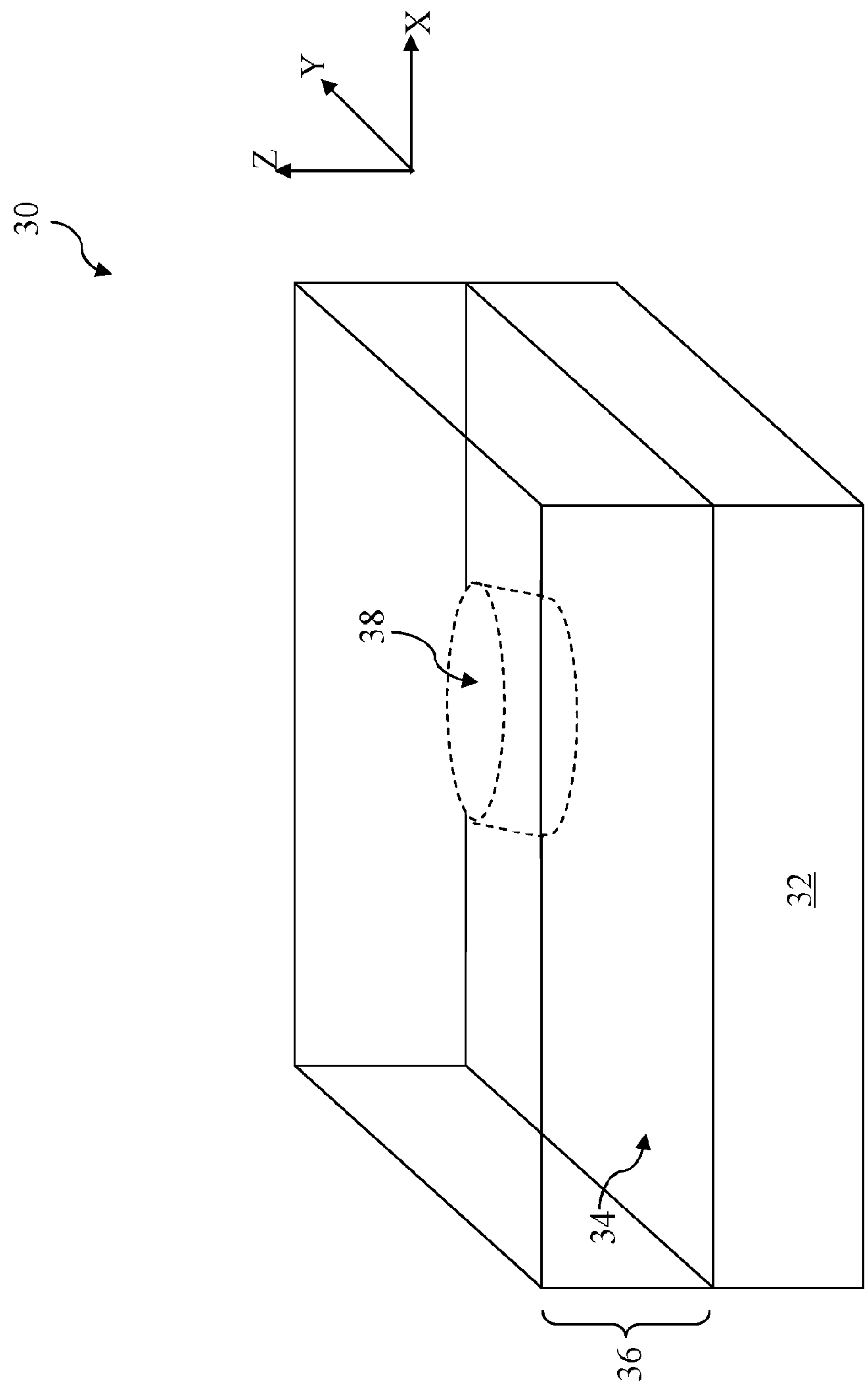

Illustrated in FIG. 1 is a flowchart of a method 20 for fabricating a semiconductor device that includes a capacitor and an inductor integrated together. FIGS. 2 and 3 are diagrammatic fragmentary cross-sectional side views of a semiconductor device 30 fabricated according to the various aspects of the present disclosure. The semiconductor device 30 and the method 20 making the same are collectively described with references to FIGS. 1 through 3 and with additional references to FIGS. 4 through 15.

The semiconductor device 30 may include an integrated circuit (IC) chip, system on chip (SoC), or portion thereof, that may include various passive and active microelectronic devices such as resistors, capacitors, inductors, diodes, metal-oxide semiconductor field effect transistors (MOSFET), complementary metal-oxide semiconductor (CMOS) transistors, bipolar junction transistors (BJT), laterally diffused MOS (LDMOS) transistors, high power MOS transistors, or other types of transistors. It is understood that the Figures discussed herein have been simplified for a better understanding of the inventive concepts of the present disclosure. Accordingly, it should be noted that additional processes may be provided before, during, and after the method 20 of FIG. 1, and that some other processes may only be briefly described herein.

Referring to FIGS. 1 and 2, the method 20 begins with block 22 in which a substrate 32 is provided. In one embodiment, the substrate 32 is a silicon substrate doped with either a P -type dopant such as boron, or doped with an N-type dopant such as arsenic or phosphorous. The substrate 32 may be made of some other suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide. Further, the substrate 32 could include an epitaxial layer (epi layer), may be strained for performance enhancement, and may include a silicon-on-insulator (SOI) structure.

Although not specifically shown for the sake of simplicity, a plurality of electronic components may be formed in the substrate 32. For example, source and drain regions of FET transistor devices may be formed in the substrate. The source and drain regions may be formed by one or more ion implantation or diffusion processes. As another example, isolation structures such as shallow trench isolation (STI) structures or deep trench isolation (DTI) structures may be formed in the substrate to provide isolation for the various electronic components. These isolation structures may be formed by etching recesses (or trenches) in the substrate 32 and thereafter filling the recesses with a dielectric material, such as silicon oxide, silicon nitride, silicon oxy-nitride, fluoride-doped silicate (FSG), and/or a low-k dielectric material known in the art.

The substrate 32 has an upper surface 34. The surface 34 is a two-dimensional plane that is defined by an X-axis and a Y-axis, where the X-axis and Y-axis are perpendicular, or orthogonal, to each other. The X-axis and the Y-axis may also be referred to as an X-direction and a Y-direction, respectively.

Referring to FIGS. 1 and 3, the method 20 begins with block 24 in which an interconnect structure 36 is formed over the upper surface 34 of the substrate 32. In other words, the interconnect structure 36 is disposed over the surface 34 in a Z-axis, or a Z-direction that is perpendicular to the surface 34. The interconnect structure 36 includes a plurality of patterned dielectric layers and interconnected conductive layers. These interconnected conductive layers provide interconnections (e.g., wiring) between circuitries, inputs/outputs, and various doped features formed in the substrate 32. In more detail, the interconnect structure 36 may include a plurality of interconnect layers, also referred to as metal layers (e.g., M1, M2, M3, etc.). Each of the interconnect layers includes a plurality of interconnect features, also referred to as metal lines. The metal lines may be aluminum interconnect lines or copper interconnect lines, and may include conductive materials such as aluminum, copper, aluminum alloy, copper alloy, aluminum/silicon/copper alloy, titanium, titanium nitride, tantalum, tantalum nitride, tungsten, polysilicon, metal silicide, or combinations thereof. The metal lines may be formed by a process including physical vapor deposition (PVD), chemical vapor deposition (CVD), sputtering, plating, or combinations thereof. In other embodiments, the method to form the metal lines and vias/contacts includes a process including deposition and etching or a damascene process.

The interconnect structure 36 includes an interlayer dielectric (ILD) layer that provides isolation between the first metal layer and the substrate and include inter-metal dielectric (IMD) layers that provide isolation between the metal layers. The ILD and IMD layers may include a dielectric material such as an oxide material. The interconnect structure 36 also includes a plurality of vias/contacts that provide electrical connections between the different metal layers and/or the features on the substrate. For the sake of simplicity, the metal lines in the interconnect layers, the vias/contacts interconnecting the metal lines, and the dielectric material separating them are not specifically illustrated herein.

The interconnect structure 36 is formed in a manner such that a passive device 38, having a capacitor and an inductor integrated together, is formed in the interconnect structure. The passive device 38 is formed with at least some of the conductive lines and at least some of the vias of the interconnect structure.

In the depicted embodiment, the passive device 38 is an inductor capacitor (LC) tank that may be used in an integrated circuit having an oscillator. The LC tank is formed using a subset of the conductive lines and a subset of the vias. The LC tank includes an inductor that has an inductive coil (or coil feature or winding feature) having one or more turns. In one example, each turn is disposed in one metal layer and connected through via feature(s) to other turn(s). Accordingly, the inductor with a plurality of turns spans a plurality of metal layers (levels). The inductor further includes a shielding structure configured to shield the winding feature of the inductor. The LC tank includes a capacitor that has an anode component and a cathode component. Particularly, the cathode component is interdigitated with the anode component. The inductor and the shielding structure is configured to surround the capacitor. In one embodiment, the shield structure is configured to couple to a grounding line. Alternatively, the shielding structure is configured to be floating.

Figure 4:
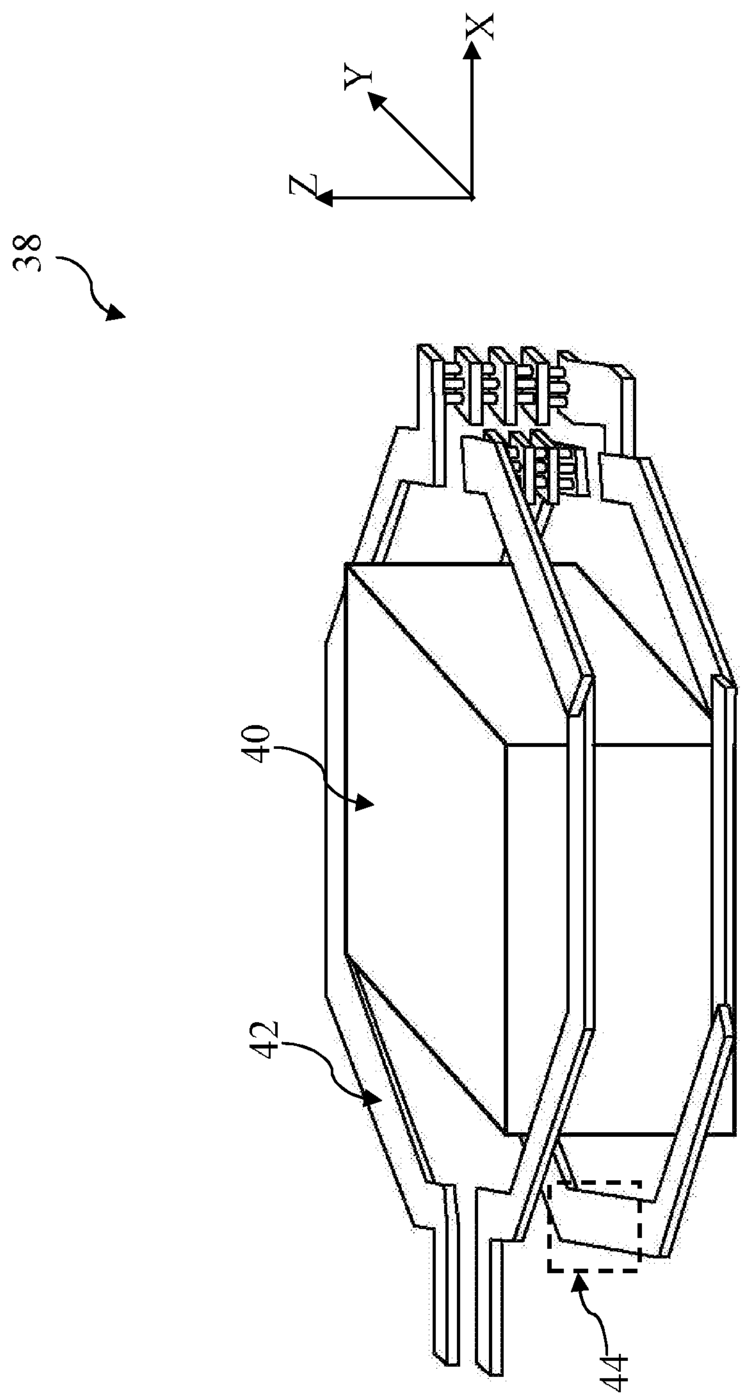
FIG. 4 illustrates a perspective view of an inductor capacitor (LC) tank according to an embodiment.

The passive device 38 is further illustrated in FIG. 4 as a diagrammatic drawing and is further described. The passive device 38 includes a capacitor 40 and an inductor 42 surrounding the capacitor 40. State differently, the capacitor 40 and the inductor 42 are disposed in a same region of the substrate and are configured such that the capacitor 40 is located inside the inductor 42 in a top view. In the present example as illustrated in FIG. 4, the inductor 42 includes two turns. The inductor 42 includes a coil feature and a shielding feature configured to shield the winding feature. The structure of the inductor 42 is further described with a portion 44 of the inductor 42 illustrated in FIG. 5.

Figure 5:
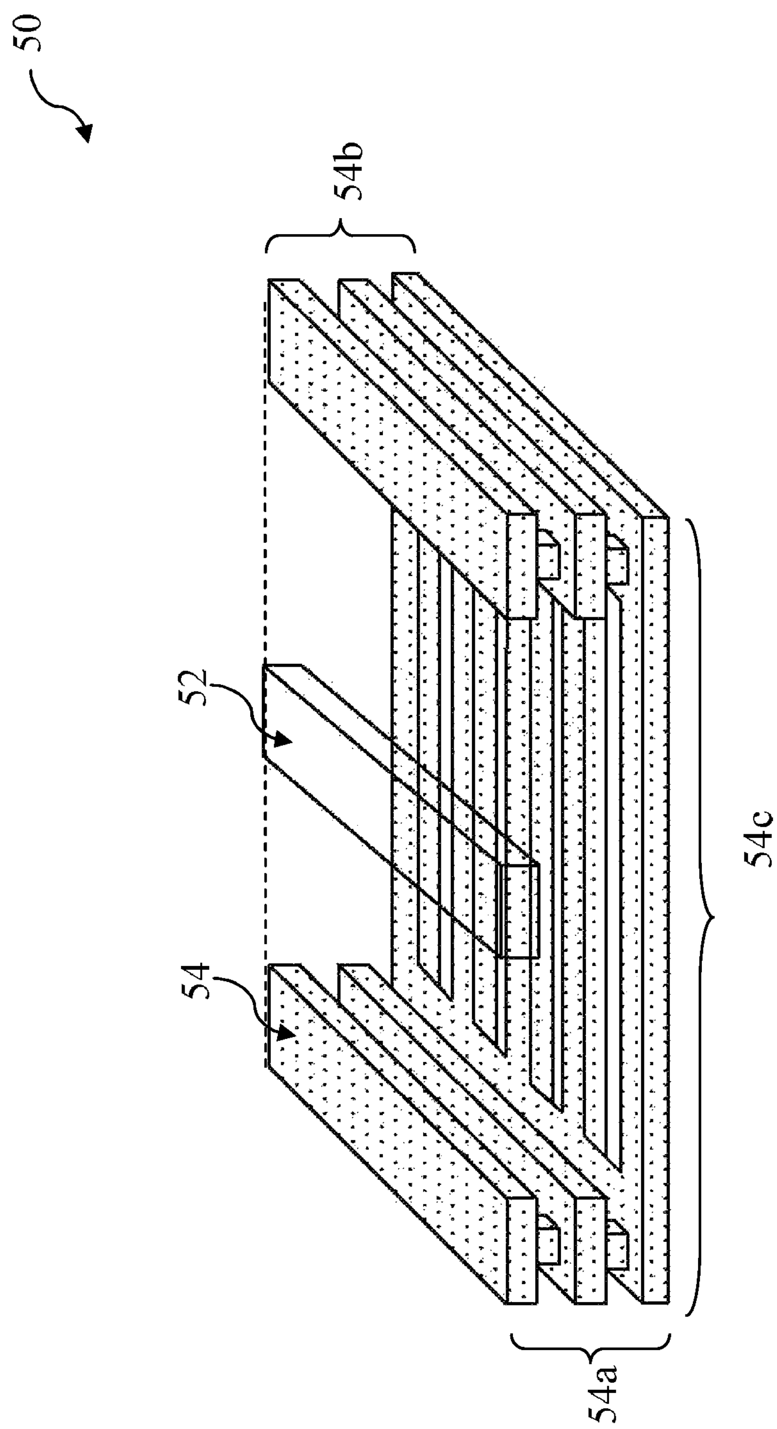
FIG. 5 illustrates a perspective fragmentary view of an inductor of the LC tank in FIG. 4.
Figure 6:
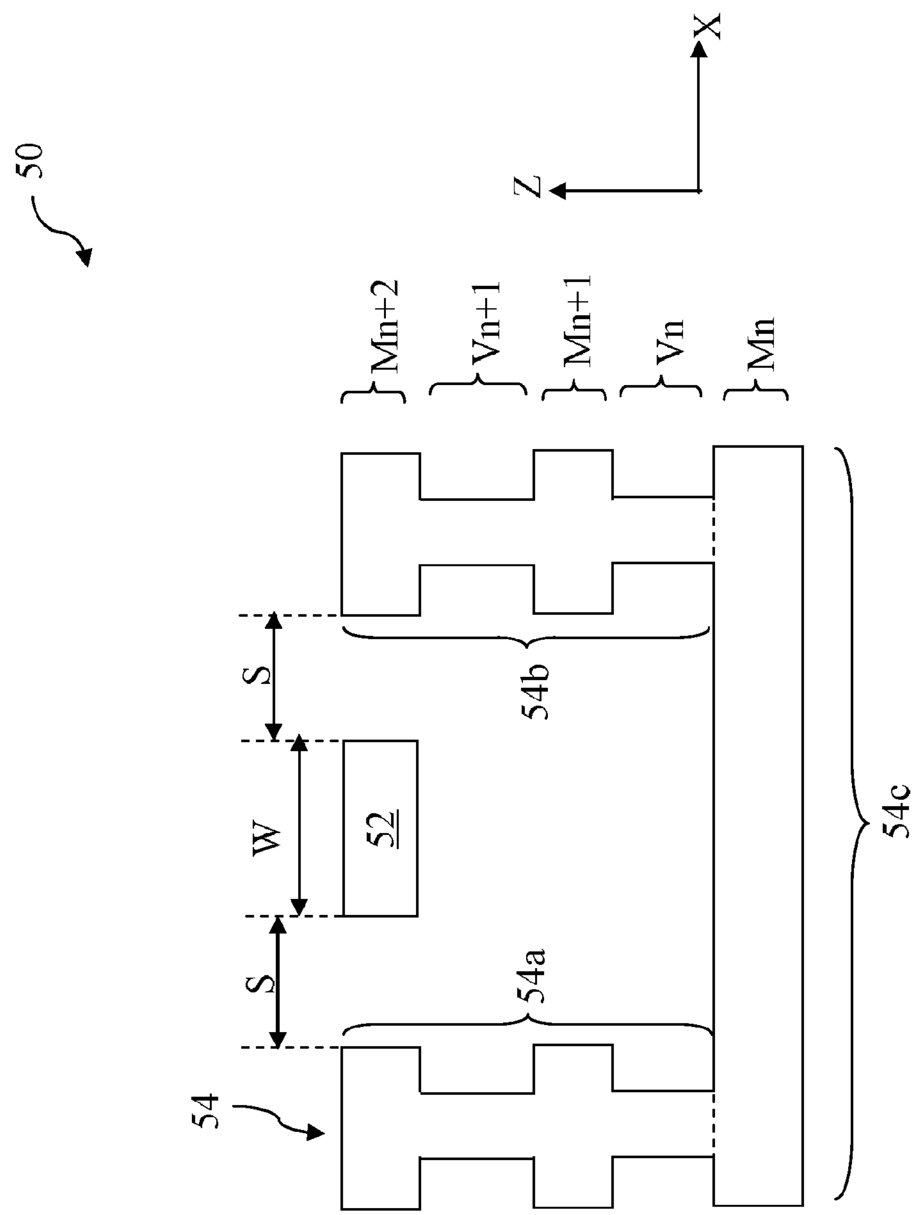
FIGS. 6 and 7 illustrate a sectional view and a top view of an inductor according to various embodiments.

FIG. 5 is a diagrammatic fragmental view of an inductor 50 constructed according to various aspects of the present embodiment. FIG. 6 is a sectional fragmental view of the inductor 50. The inductor 50 illustrated in FIG. 5 and FIG. 6 is only a segment 44 of the inductor 42 in FIG. 4. With reference to FIGS. 4, 5 and 6, the inductor segment 50 is described. The inductor 50 includes a coil feature 52 wound one or more turns and configured to take an electrical signal for induction. In one embodiment, the coil feature 52 includes a metal line formed with other portion of the interconnect structure. The inductor 50 further includes a shielding structure 54 configured to shield the winding feature 52 of the inductor 50 from the capacitor 40 and other proximate conductive features of the interconnect structure. The shielding structure 54 includes a plurality of metal lines and via features connecting respective metal lines. In one embodiment, the shielding structure 54 is configured to couple with a grounding line. The shielding structure 54 and the coil feature 52 are thus configured to a transmission line structure, in which the coil feature 52 is the signal line and the shielding structure 54 is the ground line. In another embodiment, the shielding structure 54 is designed in a slot-type configuration such that the coil feature is positioned in the slot.

In one embodiment, the shielding structure 54 includes a first side portion 54*a* and a second side portion 54*b* disposed on both sides of the coil feature 52. The side portions 54*a* and 54*b* each include a plurality of metal lines and a plurality of via features spanned vertically to provide a shielding function to the coil feature 52. Particularly, the side portions 54*a* and 54*b* span vertically (along the Z axis). The side portions 54*a* and 54*b* further span horizontally (in the plane defined by the X axis and the Y axis) and bend with the coil feature to surround the capacitor 40 and form one or more turns. For example, the metal lines and via features in each segment of the side portions 54*a* and 54*b* are extended along a direction in the plane of the substrate defined by the X axis and the Y axis. In another embodiment, the shielding structure 54 further includes a bottom portion 54c underlying the respective portion of the coil feature 52 and connected with the first and second side portions 54*a* and 54*b*.

Referring to FIG. 6, the inductor 50 is disposed in a plurality of metal layers of the interconnect structure. In the depicted embodiment, the interconnect structure includes a plurality metal layers, such as $M_n$, $M_{n+1}$ and $M_{n+2}$, and further includes various layers of via features (or via layers), such as $V_n$ and $V_{n+1}$. In the present example, the coil feature 52 is disposed in the metal layer $M_{n+2}$; the bottom portion 54*c* of the shielding structure 54 is disposed in the metal layer $M_n$; and the side portions 54*a* and 54*b* of the shielding structure 54 are disposed in metal layers $M_{n+1}$ and $M_{n+2}$, and via layers $V_n$ and $V_{n+1}$. The side portions 54*a* and 54*b* each includes a conductive stack having metal lines and via features stacked along the Z axis. The conductive stack is extended horizontally and bends with the coil feature 52. The coil feature 52 has a width "W" and is positioned to have a spacing "S" to the side portions (54*a* and 54*b*) as illustrated in FIG. 6. The parameters S and W are tunable parameters to be utilized to tune the characteristic of the inductor 50. For example, the parameters S and W may be designed and sized to create slow -wave feature of the inductor.

Figure 7:
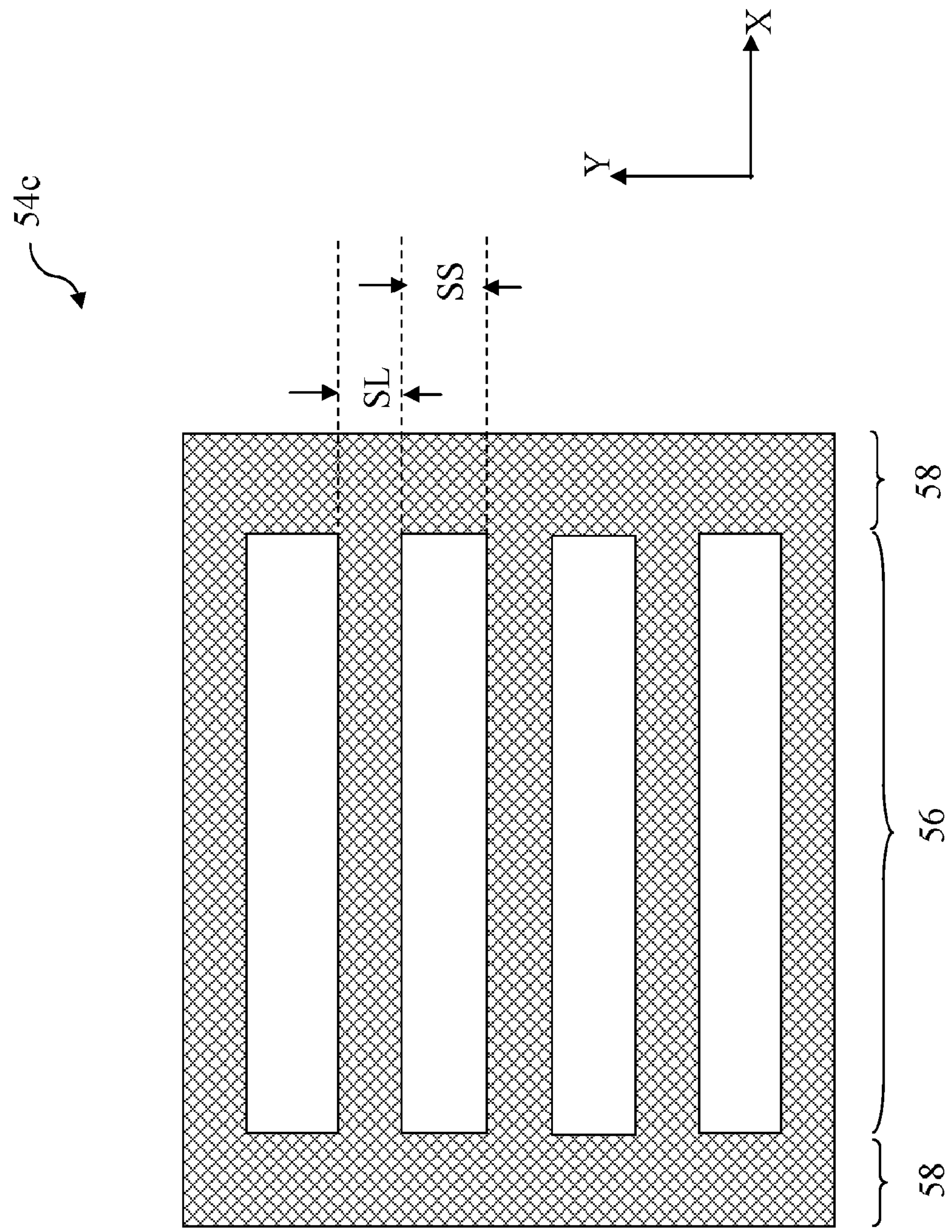

The bottom portion 54*c* of the shielding structure 54 is further shown in FIG. 7, as a top view, constructed according to one embodiment. The bottom portion 54*c* spans in the plane defined by the X axis and the Y axis. The bottom portion 54*c* includes various metal lines belong to a same metal layer ($M_n$ in this example). Particularly, the bottom portion 54*c* includes a plurality of metal lines 56 oriented in a first direction and further includes two meal lines 58 oriented in a second direction perpendicular to the first direction. The second direction is substantially along the direction of the coil feature 52. Therefore, the second direction changes along the coil feature. State differently, the second direction in each segment is different from the second direction in another segment. The first direction changes accordingly. The two metal lines 58 are connected to the metal lines 56 and surround the metal lines 56. In one embodiment, the plurality of metal lines 56 are configured in a periodic structure. The metal lines 56 include a same width "SL" and a same spacing "SS". Various geometrical dimensions of the shielding structure, including W, S, SS and SL, are designed and tuned for various device design goals, such as creating slow wave for reduced form factor and device size and/or obtaining a desired resonant frequency in the microwave circuit design.

Figure 8:
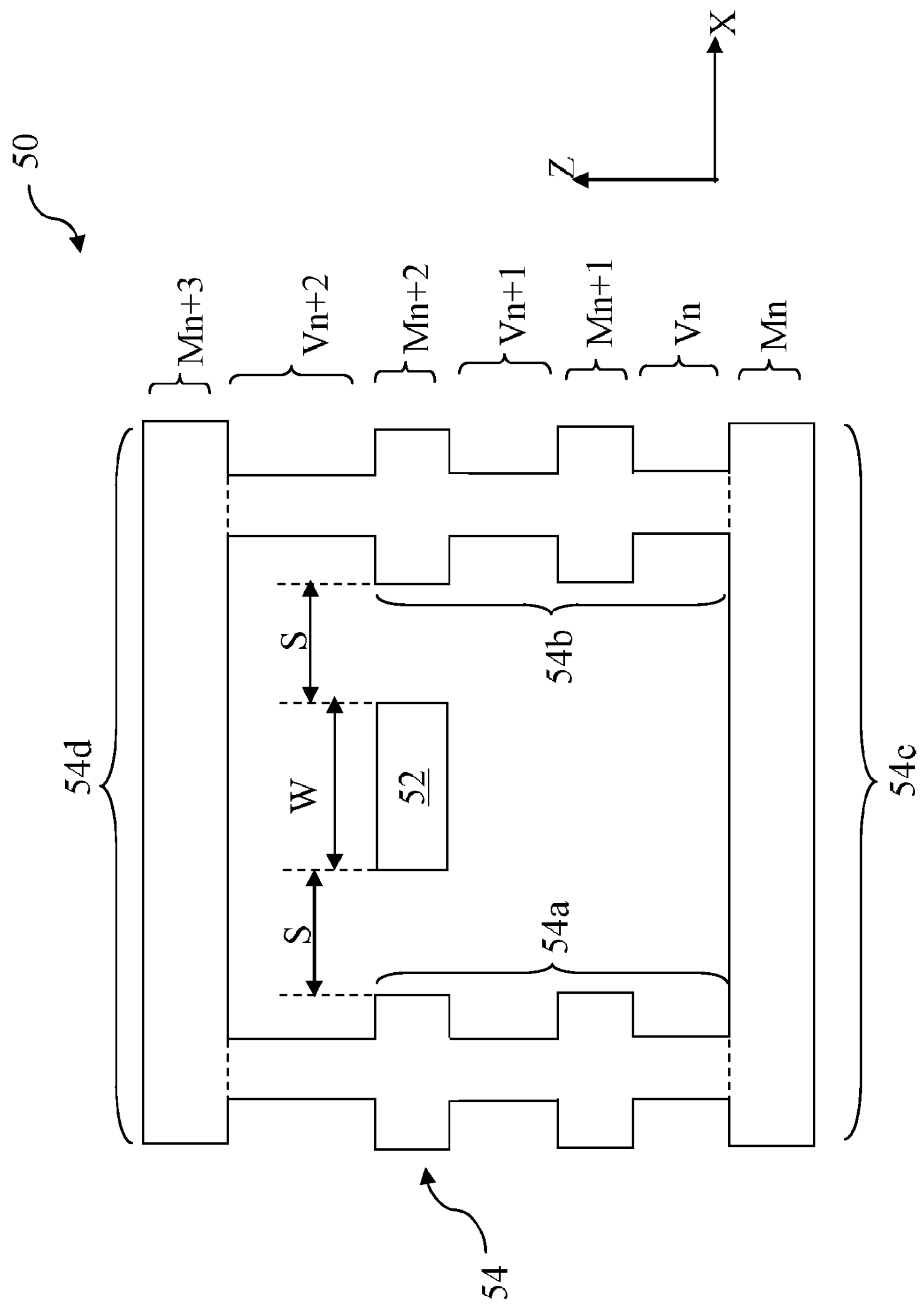
FIG. 8 illustrates a sectional view of an inductor in another embodiment.

In yet another embodiment, the shielding structure 54 further includes a top portion 54d overlying the respective portion of the coil feature 52 and connected with the first and second side portions 54*a* and 54*b*, as illustrated in FIG. 8 as a sectional view. Accordingly, the coil feature 52 is enclosed in the shielding structure 54 by respective first side portion, second side portion, bottom portion and top portion. In this embodiment with reference to FIG. 8, the inductor 50 includes the coil feature 52 and shielding structure 54 having the first and second side portions 54*a* and 54*b*, the bottom portion 54*c* and the top portion 54*d*, configured such that the coil feature is enclosed. The inductor 50 in FIG. 8 is similar to the inductor 50 in FIG. 6 but with additional top portion in the shielding structure 54.

Still referring to FIG. 8, the inductor 50 is disposed in a plurality of metal layers of the interconnect structure. In the depicted embodiment, the interconnect structure includes a plurality metal layers, such as $M_n$, $M_{n+1}$, $M_{n+2}$, and $M_{n+3}$ and further includes various layers of via features (or via layers), such as $V_n$, $V_{n+1}$, and $V_{n+2}$. In the present example, the coil feature 52 is disposed in the metal layer $M_{n+2}$; the bottom portion 54*c* of the shielding structure 54 is disposed in the metal layer $M_n$; the top portion 54*d* of the shielding structure 54 is disposed in the metal layer $M_{n+3}$; and the side portions 54*a* and 54*b* of the shielding structure 54 are disposed in metal layers $M_{n+1}$ and $M_{n+2}$, and via layers $V_n$, $V_{n+1}$ and $V_{n+2}$. The side portions 54*a* and 54*b* each includes a conductive stack having metal lines and via features stacked along the Z axis. The conductive stack is extended horizontally and bends with the coil feature 52. The coil feature 52 has a width "W" and is positioned to have a spacing "S" to the side portions (54*a* and 54*b*) as illustrated in FIG. 8. The parameters S and W are tunable parameters to be utilized to tune the characteristic of the inductor 50. For example, the parameters S and W may be designed and sized to create slow -wave feature of the inductor.

Each of the bottom portion 54*c* and the top portion 54*d* of the shielding structure 54 is designed with a structure as shown in FIG. 7, according to one embodiment. For example, the top portion 54*d* (or the bottom portion 54*c*) spans in the plane defined by the X axis and the Y axis. The top portion 54*d* includes various metal lines belong to a same metal layer ($M_{n+3}$ in this example). Particularly, the top portion 54*d* has a structure similar or same to the bottom portion 54*c*. For example, the top portion 54*d* includes a plurality of metal lines oriented in a first direction and further includes two side meal lines oriented in a second direction perpendicular to the first direction. The second direction is substantially along the direction of the coil feature 52. Therefore, the second direction changes along the coil feature. The side two metal lines are connected to the metal lines and surround the metal lines. In one embodiment, the plurality of metal lines are configured in a periodic structure with a same width "SL" and a same spacing "SS". Various geometrical dimensions of the shielding structure, including W, S, SS and SL, are designed and tuned to create slow wave for reduced r form factor and device size.

In various embodiments, the shielding structure 54 may be designed differently. In one embodiment, the shielding structure 54 with the two side portions 54*a* and 54*b*, the bottom portion 54*c* and the top portion 54*d* includes other number of metal layers, such as three metal layers $M_n$, $M_{n+1}$, $M_{n+2}$. In this case, the coil feature 52 is disposed in the $M_{n+1}$ layer.

Figure 9:
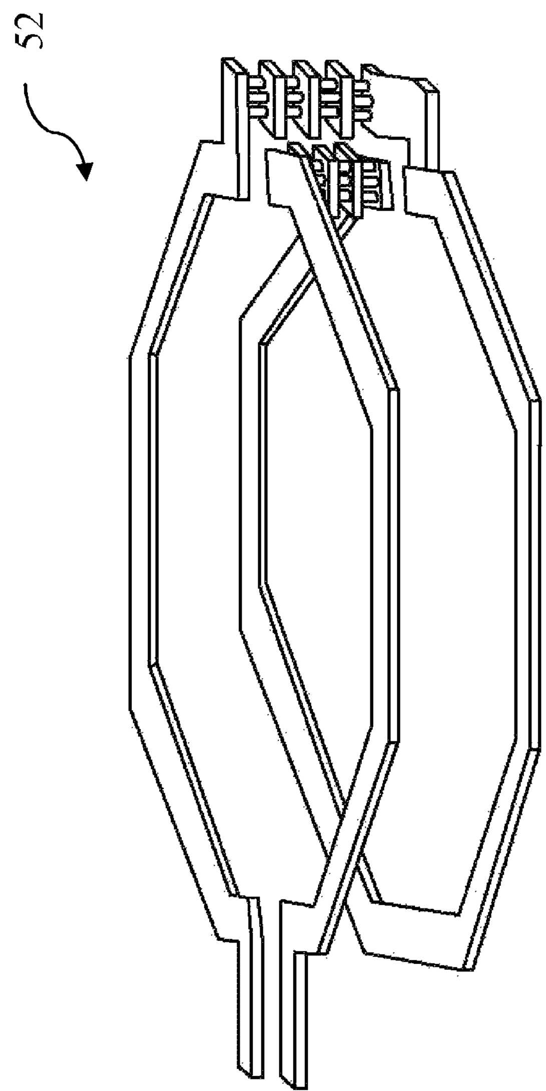
FIG. 9 is a perspective view of a coil feature of the inductor in FIG. 5 according to an embodiment.

Back the coil feature 52, it can be designed with various geometries and any proper number of turns. It is further described with reference to FIG. 9. FIG. 9*a* is a perspective view of an inductor coil 52. The inductor 52 includes two exemplary turns each disposed in respective metal layer and connected through via features or through a vertical stack of various metal features in one or more metal layers and in one or more via layers. Each turn of the inductor 52 may be designed as a polygon, such as octagon, rectangle or square. In another embodiment, the inductor 52 includes a plurality of turns extended vertically such that the capacitor is substantially enclosed and effectively shielded from the conductive features around the corresponding passive device, such as an LC tank.

Now referring back to FIG. 4, the capacitor 40 in the passive device 38 includes an anode component and a cathode component. Particularly, the cathode component is interdigitated with the anode component. Various embodiments of the capacitor 40 are provided and described below.

Figure 10:
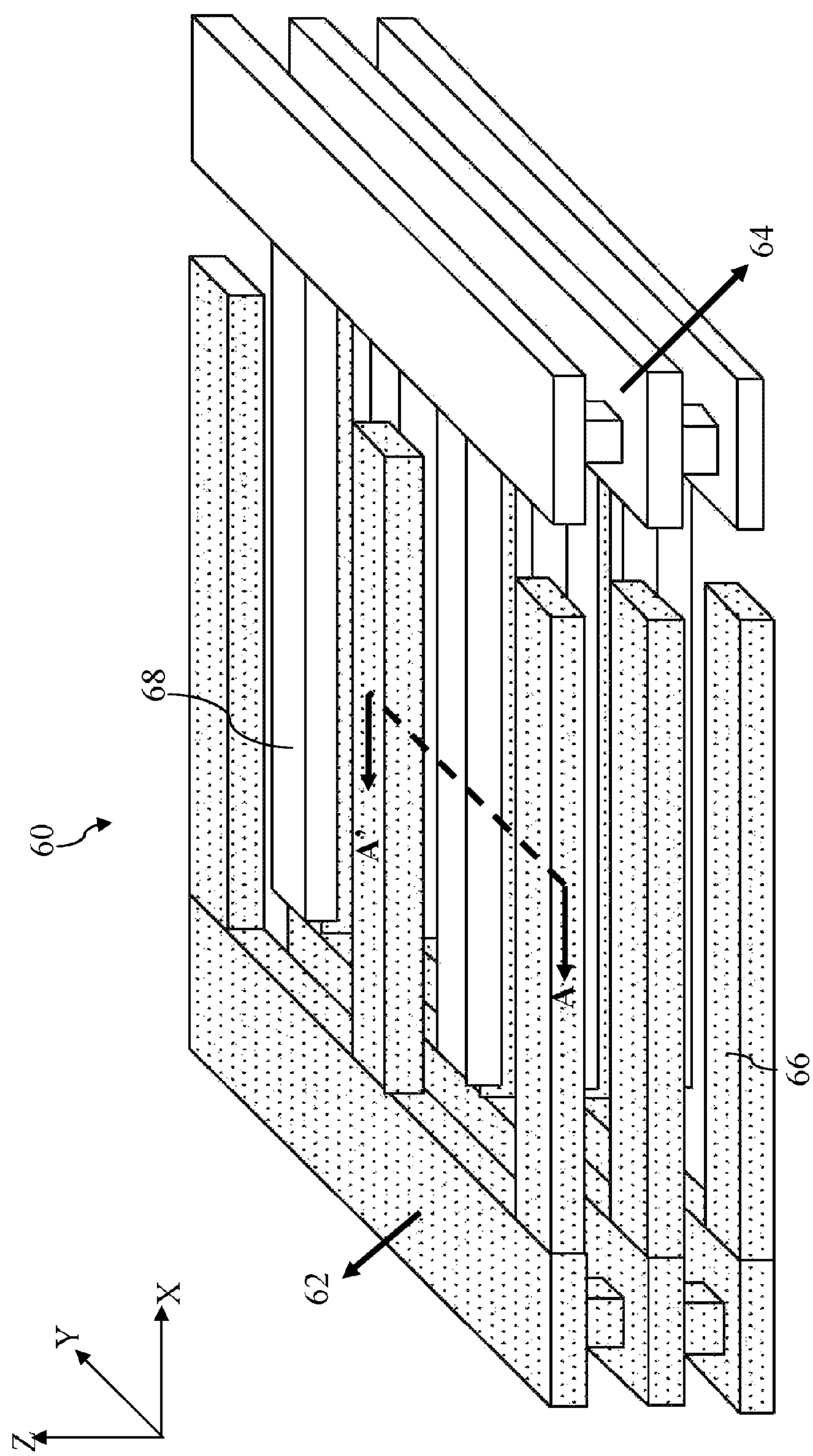
FIG. 10 is a perspective view of a capacitor of an LC tank according to an embodiment.

FIG. 10 is a perspective view of one embodiment of the capacitor 40 of FIG. 4. In FIG. 10, the capacitor 60 includes an anode component 62 and a cathode component 64. The anode component 62 includes a plurality of laterally extending elongate features 66, and the cathode component 64 includes a plurality of laterally extending elongate features 68. In an embodiment, the elongate features 66 and 68 extend in a plane substantially parallel to the surface 34 of the substrate 32. The elongate features 66 and 68 may belong to a plurality of different metal layers of the interconnect structure 36. In the embodiment shown, these elongate features 66 are interdigitated in the Y-direction with the elongate features 68 so as to increase effective capacitance.

Figure 11:
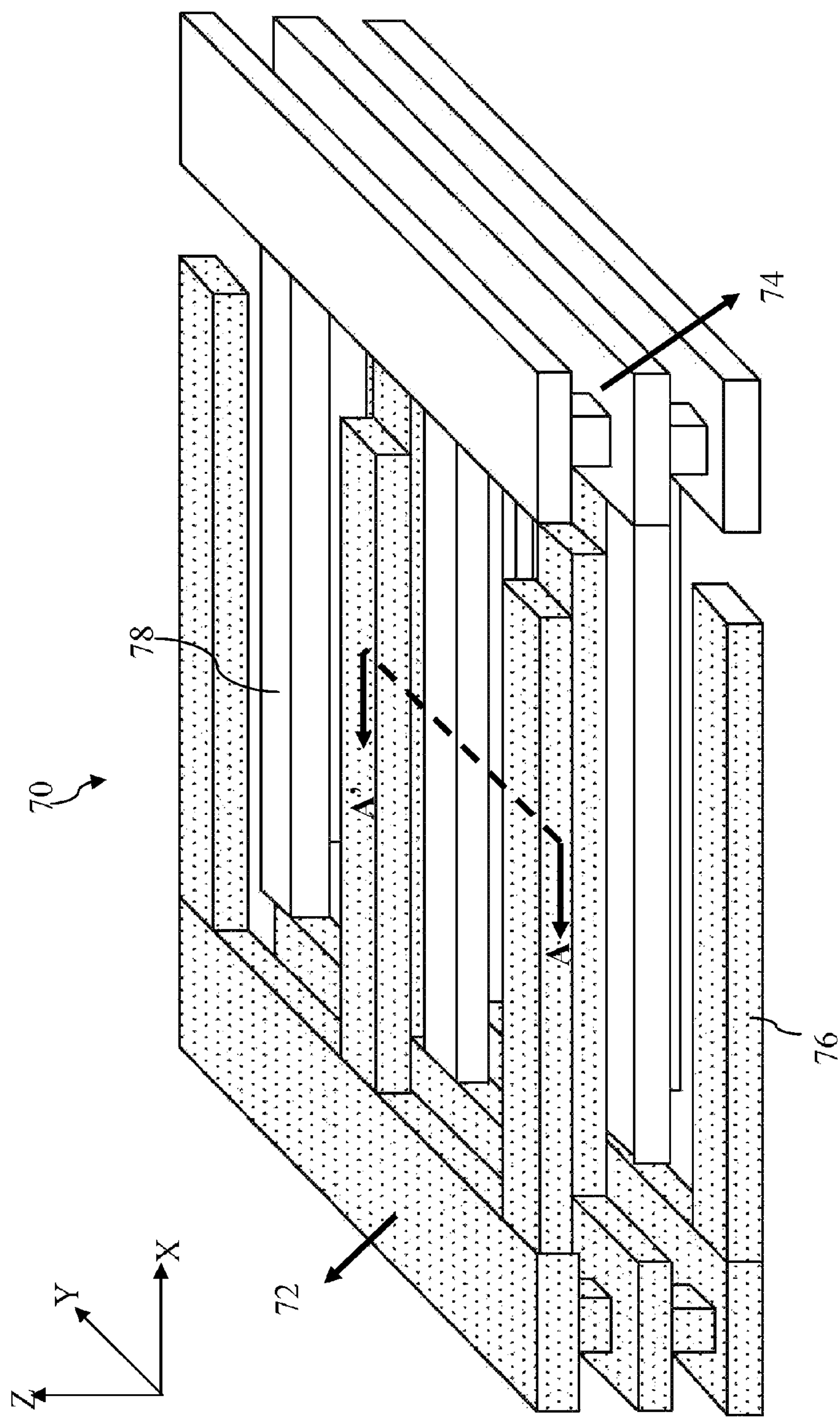
FIG. 11 is a perspective view of a capacitor of an LC tank according to another embodiment.

FIG. 11 is a perspective view of another embodiment of the capacitor 40 of FIG. 4. In FIG. 11, the capacitor device 70 includes an anode component 72 and a cathode component 74. The anode component 72 includes a plurality of laterally extending elongate features 76, and the cathode component 74 includes a plurality of laterally extending elongate features 78. In an embodiment, the elongate features 76 and 78 extend in a plane substantially parallel to the surface 34 of the substrate 32. The elongate features 76 and 78 may belong to a plurality of different metal layers of the interconnect structure 36. In the embodiment shown, these elongate features 76 are interdigitated in the Z-direction and Y-direction with the elongate features 78 so as to increase effective capacitance.

Figure 12:
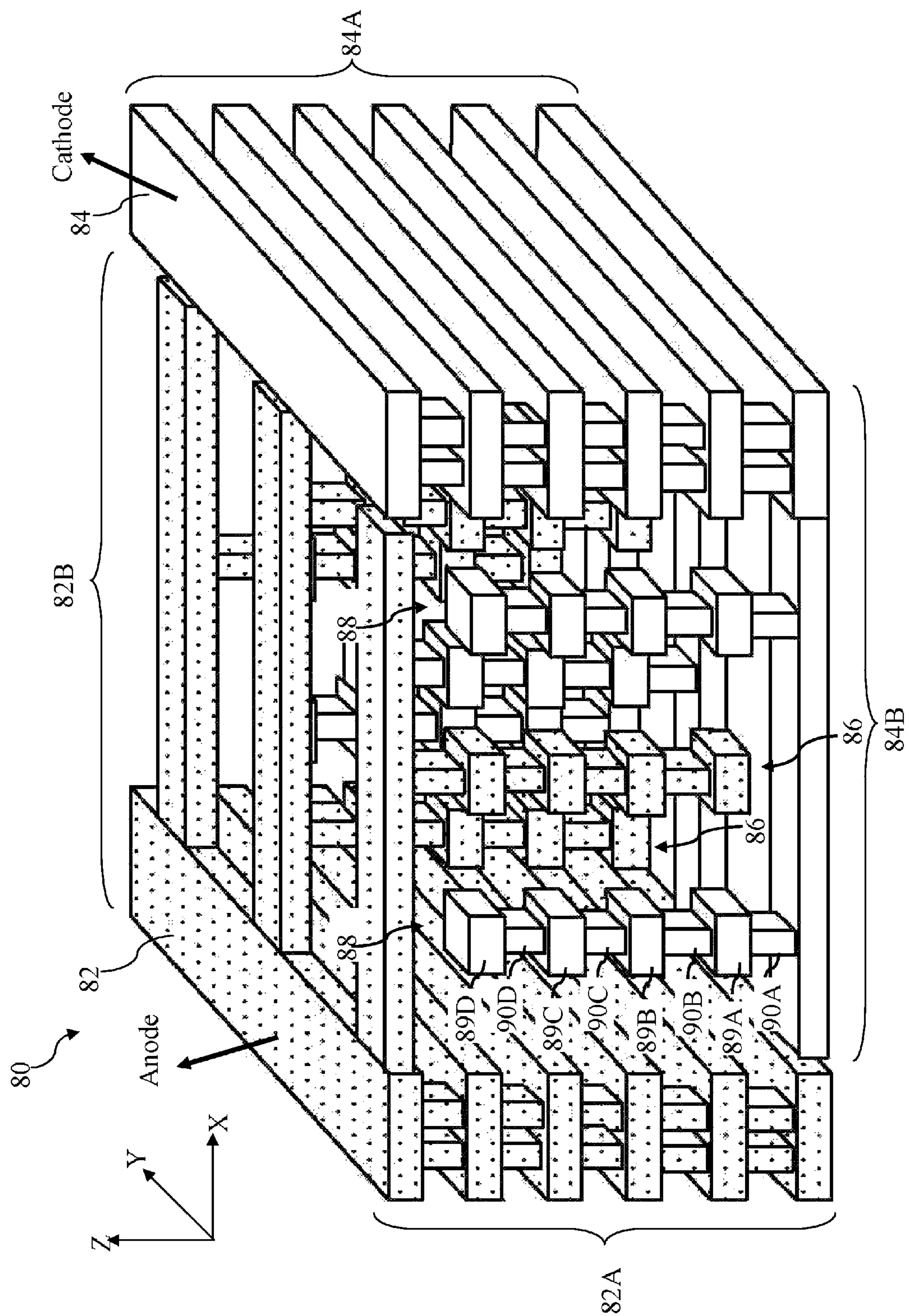
FIG. 12 is a perspective view of a capacitor of an LC tank according to another embodiment.

FIG. 12 is a perspective view of another embodiment of the capacitor 40 of FIG. 4 constructed according to aspects of the present disclosure. The capacitor 80 includes an anode component 82 and a cathode component 84. The anode component 82 includes a plurality of conductive stacks 86. The cathode component 84 includes a plurality of conductive stacks 88. According to various aspects of the present disclosure, these conductive stacks 86 and 88 each include a plurality of metal lines and a plurality of vias that interconnect the conductive components. As an example, it includes metal lines 89A, 89B, 89C, and 89D, as well as vias 90A, 90B, 90C, and 90D. In an embodiment, the metal lines 89A-89D are a subset of metal lines belonging to different interconnect layers (or metal layers) of the interconnect structure 36 of FIG. 3. In the present embodiment, the metal lines 89A-89D and the vias 90A-90D are substantially aligned in a direction along the Z-axis. However, it is understood that alternative configurations may be implemented in other embodiments. For example, the metal lines and the vias of each conductive stack may be interconnected but may not necessarily be vertically aligned. According to aspects of the present disclosure, each conductive stack is also interdigitated with a conductive stack of the opposite polarity in both the X-direction and the Y-direction or along the X and Y axes).

The anode component 82 also includes a side portion 82A and a top portion 82B, and the cathode component 84 also includes a side portion 84A and a bottom portion 84B. The side portions 82A and 84A each include a plurality of elongate metal lines interconnected vertically (in the Z-direction) by vias, where the elongate metal lines extend in the Y direction. The top and bottom portions 82B and 84B each include a plurality of elongate metal lines that extend in the X-direction. The elongate metal lines of the top portion 82B are metal lines in the same metal layer, and the elongate metal lines of the bottom portion 84B are metal lines in the same metal layer (but a different metal layer than the metal lines of the top portion 82B).

It is understood that the capacitor 80 may be implemented differently in other embodiments. For example, the capacitor device 80 may be implemented using interdigitated structures as detailed in U.S. patent application Ser. No. 13/158,044, Titled "A VERTICAL INTERDIGITATED SEMICONDUCTOR CAPACITOR" and filed on Jun. 10, 2011, the content of which is hereby incorporated by reference in its entirety. In one embodiment, the anode component 82 may have a bottom portion and the cathode component 84 may have a top portion instead. In other embodiments, the side portions and the top and bottom portions may also have alternative shapes and designs.

Figure 13:
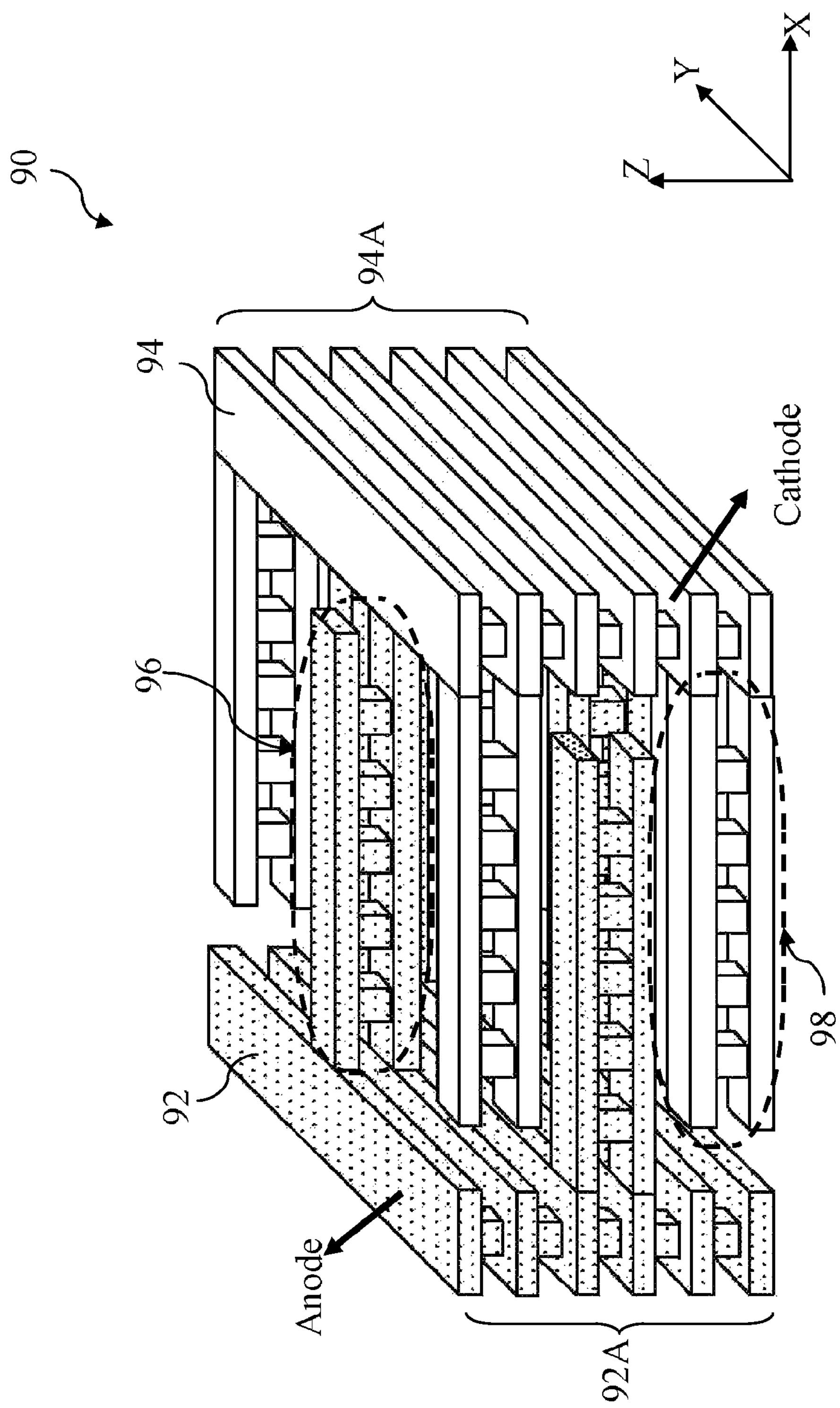
FIG. 13 is a perspective view of a capacitor of an LC tank according to another embodiment.

FIG. 13 is a perspective view of another embodiment of the capacitor 40 of FIG. 4 constructed according to aspects of the present disclosure. The capacitor 90 includes an anode component 92 and a cathode component 94. The anode component 92 and the cathode component 94 each include a plurality of conductive features. Particularly, the anode component 92 includes a plurality of first conductive features 96. The cathode component 94 includes a plurality of second conductive features 98. The first conductive features 96 are interdigitated with the second conductive features 98 along both the Y axis and the Z axis. According to various aspects of the present disclosure, these conductive features 96 and 98 each include two metal lines extending along the X-direction; and at least one via feature extending along the Z -direction and interconnecting the two metal lines. The two metal lines belong to respective metal layers. The via feature is designed to have substantially a same dimension along the X-direction and the Y-direction. Alternatively, the via feature is designed to span a first dimension along the X-direction and a second dimension along the Y-direction. The first dimension is substantially greater than the second dimension. In an alternative embodiment, the conductive features 96 and 98 are interdigitated only the Y-direction.

The anode component 92 also includes a side portion 92A, and the cathode component 94 also includes a side portion 94A. The side portions 92A and 94A each include a plurality of metal lines interconnected vertically (in the Z-direction) by vias, where the metal lines extend in the Y direction. The metal lines in the side portions 92A and 94A belong to respective metal layers. As one example illustrated in FIG. 13, the side portions 92A and 94A are formed in six consecutive metal layers. In one embodiment, the side portions 92A and 94A each span in a plane defined by the Y axis and the Z axis. Furthermore, the side portions 92A and 94A are defined in an area aligned with the array of the conductive features 96 and 98 when viewed in the X direction.

The conductive features 96 extend in the X direction and connect to the side portion 92A. The conductive features 98 extend in the X direction and connect to the side portion 94A. It is understood that in other embodiments, the anode component 92 may have the side portion 92A positioned at the right side and connected to the conductive features 96, and the cathode component 94 may have the side portion 98 positioned at the left side and connected to the conductive features 94A. In other embodiments, the side portions may also have alternative shapes and designs.

Figure 14:
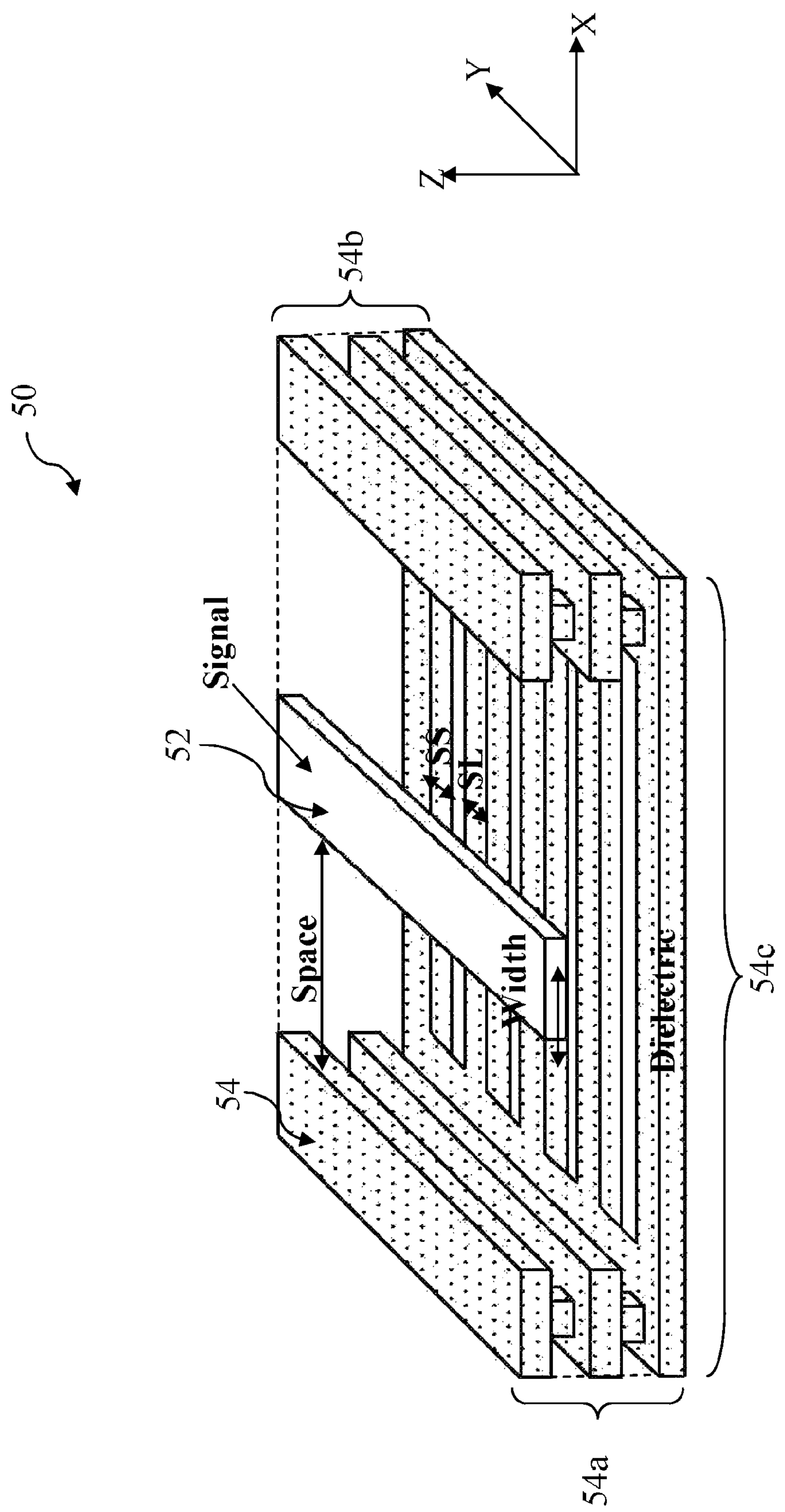
FIGS. 14 and 15 are perspective views of an inductor of an LC tank according to other embodiments.
Figure 15:
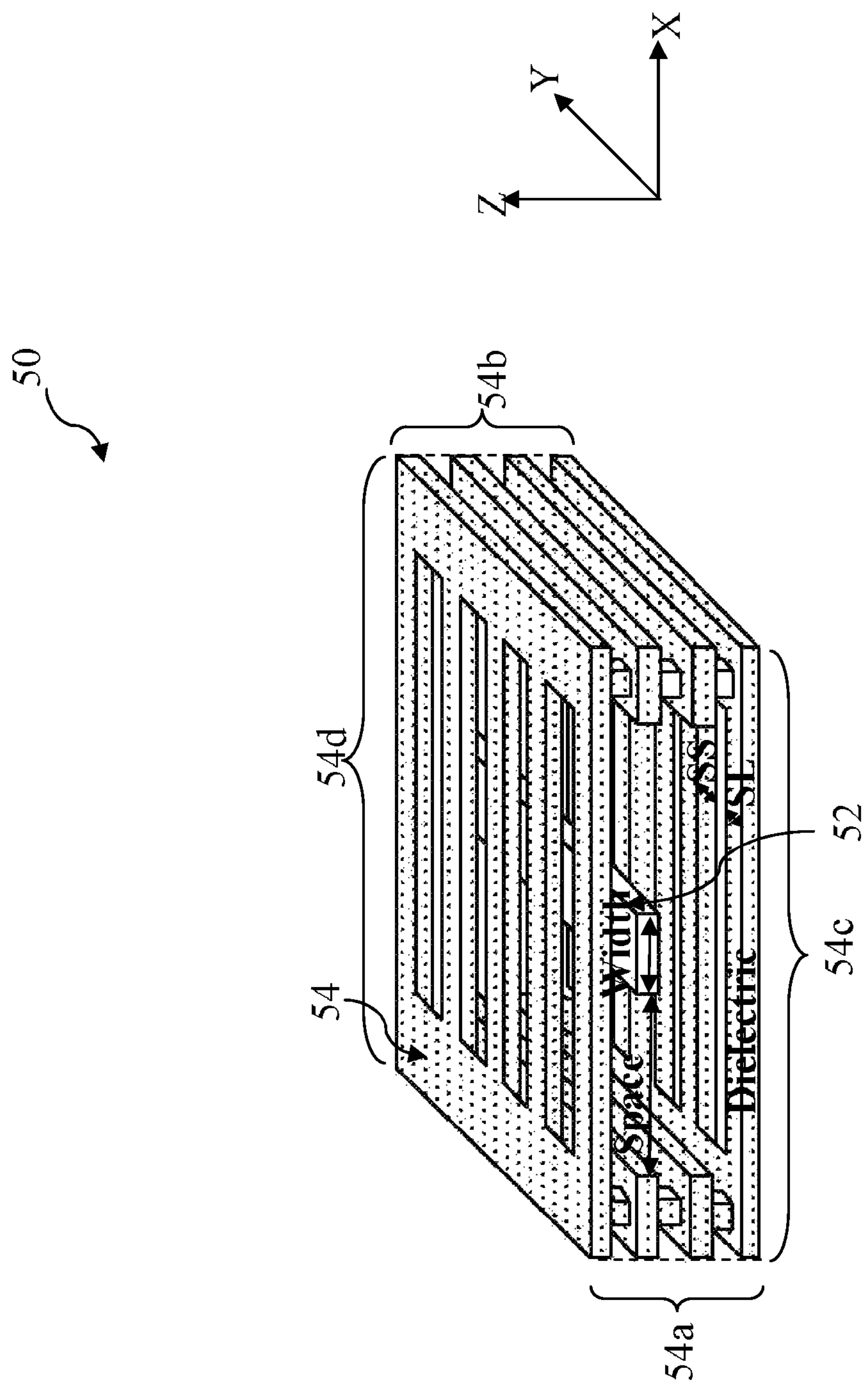

The structure of the inductor 42 is additionally illustrated in FIGS. 14 and 15 according other embodiments. FIGS. 14 and 15 are diagrammatic fragmental views of an inductor 50. The inductor 50 illustrated in FIG. 14 (or FIG. 15) is only a segment 44 of the inductor 42 in FIG. 4. With reference to FIG. 14, the inductor 50 includes a coil feature 52 wound one or more turns and configured to take an electrical signal for induction. In one embodiment, the coil feature 52 includes a metal line formed with other portion of the interconnect structure. The inductor 50 further includes a shielding structure 54 configured to shield the coil feature 52 of the inductor 50 from the capacitor 40 and other proximate conductive features of the interconnect structure. The shielding structure 54 includes a plurality of metal lines and via features connecting respective metal lines. In the depicted embodiment, the shielding structure 54 is configured to couple with a grounding line. In another embodiment, the shielding structure 54 is designed in a slot-type configuration such that the coil feature is positioned in the slot. Particularly, the shielding structure 54 includes a first side portion 54*a* and a second side portion 54*b* disposed on both sides of the coil feature 52. The side portions 54*a* and 54*b* each include a plurality of metal lines and a plurality of via features spanned vertically to provide a shielding function to the coil feature 52. Particularly, the side portions 54*a* and 54*b* span vertically (along the Z axis). The side portions 54*a* and 54*b* further span horizontally (in the plane defined by the X axis and the Y axis) and bend with the coil feature to surround the capacitor 40 and form one or more turns. For example, the metal lines and via features in each segment of the side portions 54*a* and 54*b* are extended along a direction in the plane of the substrate defined by the X axis and the Y axis. The shielding structure 54 further includes a bottom portion 54*c* underlying the respective portion of the coil feature 52 and connected with the first and second side portions 54*a* and 54*b*. In another embodiment of the inductor 50 illustrated in FIG. 15, the shielding structure 54 additionally includes a top portion 54*d* overlying the respective portion of the coil feature 52 and connected with the first and second side portions 54*a* and 54*b*.

It is understood that the passive device 38 may be implemented differently in other embodiments. For example, the capacitor 40 may be implemented using interdigitated structures. In some other embodiments, the capacitor 40 may be implemented using a varactor, such as a FinFET varactor, a varactor having a metal gate, or a combination thereof.

The inductor device and the LC tank incorporating the inductor device of the present disclosure offer advantages over conventional inductors and conventional LC tanks. It is understood that other embodiments may offer different advantages, and that no particular advantage is required for all embodiments. One advantage offered by the passive device 38 is the reduced circuit area and that the disclosed design is more immunity to the configuration of the interconnect structure around the passive device. Since the coil feature 52 of the inductor is shielded by the disclosed shielding structure 54, the capacitor 40 is able to be positioned in the same region with the inductor 42. Specifically, the capacitor 40 is disposed inside the inductor without causing interference. The structure offers flexible metal routing. The slot-shielding structure creates the slow-wave effects, resulting in a more efficient utilization of valuable chip area.

Another advantage offered by the passive device 38 is the disclosed structure and method provide an efficient approach for precise inductance prediction. In the existing method, it takes more silicon tape-out times and effort to obtain a desired resonant frequency in microwave circuit design. The disclosed structure and the method of the passive device 38 (such as an LC tank) has the shielding structure 54 that defines the return path (-the shielding structure), resulting in a flexible inductance value adjustment.

Another advantage offered by the passive device 38 is the immunity of the passive device to the surroundings and reduced loss in the substrate and in the interconnect structure around the passive device 38.

Yet another advantage offered by the passive device with the shielding structure 54 of the present disclosure is lower thermal noise. The inductor herein can achieve the same inductance value as a conventional inductor while using a shorter length coil. The shorter length coil leads to a lower parasitic resistance value of the inductor. The lower resistance value reduces thermal noise, which is correlated to 4 KTR, where K is Boltzmann's constant, T is a resistor's absolute temperature in Kelvins, and R is the resistor's resistance value in ohms. Therefore, the inductor device herein can achieve a lower thermal noise than conventional inductor devices. In addition, the reduced parasitic resistance increases the quality factor of the inductor and the corresponding passive device as well.

A further advantage offered by the passive device with the shielding structure is more precise resonant frequency adjustment. The LC tank disclosed herein defines the return path clearly. The inductance values of the inductor device can be flexibly adjusted by changing its windings. The resonant frequency of an LC tank is correlated to the inverse of the square root of (inductance of inductor x capacitance of capacitor) as $f_{frequency} \propto 1/(LC)^{1/2}$ where L and C are corresponding inductance and capacitance, respectively. Thus, the flexibility of inductance adjustment means that the resonant frequency can be flexibility tuned as well. This may also reduce silicon tape-out time, which reduces fabrication costs and reduces time-to-market delays.

Although the present disclosure provides various embodiments of a passive device including an inductor and a capacitor coupled to form a functional circuit or a portion of a circuit, such as an LC tank. Specifically, in the passive device, the capacitor is surrounded by the inductor. The inductor includes a coil feature and a shielding feature surrounding the coil feature. The shielding feature may be configured to connected to a ground line and forms with the coil feature a transmission line inductor structure. Other embodiments may be implemented according to the spirit of the present disclosure. In one embodiment, the side portions of the shielding structure may be formed in more metal layers. In another embodiment, the capacitor may include other suitable capacitive structure, such as a varactor. In yet another embodiment, the inductor includes one turn, a portion of a turn, two or more turns. For example, the coil only includes a half turn or even a straight line or two straight lines connected. The shielding structure is configured accordingly.

In yet another embodiment, the shielding structure includes a plate shielding feature that is only a conductive sheet without any pattern defined therein. For example, the side portions of the shielding structure are two plate features each including two or more metal lines and at least one elongated via feature configured to form a conductive plate. In another example, the bottom portion (and/or the top portion) includes a conductive plate in one metal layer. In this example, the conductive plate may be regarded as a plurality of parallel metal lines merged together into a large continuous conductive feature. In yet another embodiment, at least a subset of the side portions, the bottom portion and the top portion of the shielding structure includes conductive plates. A conductive plate is a feature spanning in two dimensions (e.g., X and Y directions) with a first dimension D1 in a first direction and a second dimension D2 in a second direction. Each of the first dimension D1 and the second dimension D2 is substantially greater than the respective width of metal lines.

Thus, the present disclosure provides one embodiment of a semiconductor device. The semiconductor device includes a substrate having a surface that is defined by an X axis and a Y axis that is perpendicular to the X axis; a capacitor disposed over the substrate; an inductor disposed over the surface of the substrate and having a coil feature surrounding the capacitor; and a shielding structure over the substrate and configured around the coil feature.

In one embodiment, the capacitor and the inductor are coupled to form an inductor capacitor (LC) tank. In another embodiment, the shielding structure is configured to be coupled to a grounding power line.

In yet another embodiment, the shielding structure includes a first side portion and a second side portion both perpendicular to the surface of the substrate, the first and second side portions being interposed by the coil feature. In one example, the first and second side portions each include first and second metal lines each belong to a respect metal layer; and a via feature connecting the first and second metal lines along a third axis perpendicular to the X axis and the Y axis. In furtherance of the example, the via feature is an elongate via feature.

In another embodiment, the shielding structure further includes a bottom portion configured with the first and second side portions to shield the coil feature of the inductor. In one example, the bottom portion of the shielding structure includes a plurality of metal lines in a same metal layer; and the plurality of metal lines are configured to a periodic structure such that distances between neighbor metal lines are substantially equal. In yet another embodiment, the shielding structure further includes a top portion configured with the first side portion, the second side portion and the bottom portion such that the coil feature is enclosed.

In another embodiment, the capacitor includes an anode component that includes a plurality of first conductive features and a cathode component that includes a plurality of second conductive features, the first conductive features are interdigitated with the second conductive features.

In one example, the first conductive features are interdigitated with the second conductive features along both the Y axis and a Z axis that is perpendicular to the surface of the substrate. In furtherance of the example, the first conductive features and the second conductive features each include two metal lines extending along the X axis; and at least one metal via extending along the Z axis and interconnecting the two metal lines.

In another example, the first conductive features and the second conductive features each extend along a Z axis that is perpendicular to the surface of the substrate; and the first conductive stacks are interdigitated with the second conductive stacks along both the X axis and the Y axis.

In another example, the first and second conductive features each include a plurality of metal lines interconnected along the third axis by a plurality of via features; and an interconnect structure having a plurality of interconnect layers is disposed over the substrate, and wherein the metal lines each belong to a respective interconnect layer of the interconnect structure.

In yet another embodiment, the coil feature of the inductor includes a first portion in a first metal layer and a second portion in a second metal layer, the first and second portions are connected by at least one via feature.

The present disclosure also provides another embodiment of a semiconductor device. The semiconductor device includes a semiconductor substrate; and an interconnect structure formed over the substrate. The interconnect structure includes a capacitor having an anode component and a cathode component; and an inductor that is wound around the capacitor and is coupled with the capacitor, wherein the inductor includes a coil feature and a shielding feature surrounding the coil feature.

In one embodiment of the semiconductor device, the shielding feature is connected a grounding line and the shielding structure further includes a first side portion and a second side portion interposed by the coil feature; and a bottom portion underlying the inductor coil and connected with the first and second side portions. In furtherance of the embodiment, the bottom portion includes a plurality of metal lines equally spaced.

In another embodiment, the capacitor includes an anode component that includes a plurality of first conductive features and a cathode component that includes a plurality of second conductive features, the first conductive features are interdigitated with the second conductive features.

The present disclosure also provides an embodiment of a method of fabricating a semiconductor device. The method includes providing a substrate; and forming an interconnect structure over the substrate, the interconnect structure having a plurality of conductive lines interconnected by a plurality of vias, wherein the forming the interconnect structure includes forming an inductor capacitor (LC) tank using a subset of the conductive lines and a subset of the vias. The LC tank includes a capacitor that is formed to have an anode component and a cathode component that is interdigitated with the anode component. The LC tank includes an inductor having a coil feature and a shielding feature surrounding the coil feature, both the coil feature and the shielding feature are wounding around the capacitor.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor device, comprising:

a substrate having a surface that is defined by an X axis and a Y axis that is perpendicular to the X axis;

a capacitor disposed over the substrate surface;

an inductor disposed over the surface of the substrate and having a coil feature surrounding the capacitor; and a shielding structure over the substrate and configured around the coil feature, the shielding structure and the coil feature being formed from a first material layer.

2. The semiconductor device of claim 1, wherein the shielding structure is configured to be coupled to a grounding power line.

3. The semiconductor device of claim 1, wherein the capacitor and the inductor are coupled to form an inductor capacitor (LC) tank.

4. The semiconductor device of claim 1, wherein the shielding structure includes a first side portion and a second side portion both perpendicular to the surface of the substrate, the first and second side portions being interposed by the coil feature.

5. The semiconductor device of claim 4, wherein the first and second side portions each include:

first and second metal lines each belonging to a respective metal layer; and a via feature connecting the first and second metal lines along a third axis perpendicular to the X axis and the Y axis.

6. The semiconductor device of claim 5, wherein the via feature is an elongate via feature.

7. The semiconductor device of claim 4, wherein the shielding structure further includes a bottom portion configured with the first and second side portions to shield the coil feature of the inductor.

8. The semiconductor device of claim 7, wherein the bottom portion of the shielding structure includes a plurality of metal lines in a same metal layer; and the plurality of metal lines are configured as a periodic structure such that distances between neighboring metal lines are substantially equal.

9. The semiconductor device of claim 7, wherein the shielding structure further includes a top portion configured with the first side portion, the second side portion, and the bottom portion such that the coil feature is enclosed.

10. The semiconductor device of claim 1, wherein the capacitor includes an anode component that includes a plurality of first conductive features and a cathode component that includes a plurality of second conductive features, wherein the first conductive features are interdigitated with the second conductive features.

11. The semiconductor device of claim 10, wherein the first conductive features are interdigitated with the second conductive features along both the Y axis and a Z axis that is perpendicular to the surface of the substrate.

12. The semiconductor device of claim 11, wherein the first conductive features and the second conductive features each include:

two metal lines extending along the X axis; and at least one metal via extending along the Z axis and interconnecting the two metal lines.

13. The semiconductor device of claim 10, wherein:

the first conductive features and the second conductive features each extend along a Z axis that is perpendicular to the surface of the substrate; and the first conductive features are interdigitated with the second conductive features along both the X axis and the Y axis.

14. The semiconductor device of claim 10, wherein:

the first and second conductive features each include a plurality of metal lines interconnected along a third axis by a plurality of via features; and an interconnect structure having a plurality of interconnect layers is disposed over the substrate, and wherein the metal lines each belong to a respective interconnect layer of the interconnect structure.

15. The semiconductor device of claim 1, wherein the coil feature of the inductor includes a first portion in a first metal layer and a second portion in a second metal layer, wherein the first and second portions are connected by at least one via feature.

16. A semiconductor device, comprising:

a semiconductor substrate; and an interconnect structure formed over the substrate, the interconnect structure including:

a capacitor having an anode component and a cathode component; and an inductor disposed approximate the capacitor and coupled with the capacitor, wherein the inductor includes a coil feature having a metal line that forms one or more turns around the capacitor and a shielding structure surrounding and conforming to the metal line of the coil feature as it forms the one or more turns around the capacitor.

17. The semiconductor device of claim 16, wherein the shielding structure is connected to a grounding line and the shielding structure further includes:

a first side portion and a second side portion interposed by the metal line of the coil feature; and a bottom portion underlying the metal line of the coil feature and connected with the first and second side portions.

18. The semiconductor device of claim 16, wherein the anode component includes a plurality of first conductive features and the cathode component includes a plurality of second conductive features, wherein the first conductive features are interdigitated with the second conductive features.

* * * * *